(12) United States Patent
Pious et al.

(10) Patent No.: US 12,106,818 B2
(45) Date of Patent: Oct. 1, 2024

(54) POWER CONTROL OF A MEMORY DEVICE IN CONNECTED STANDBY STATE

(71) Applicant: Intel Corporation, Santa Clara, CA (US)

(72) Inventors: Aiswarya M. Pious, Bangalore (IN); Raji James, Bangalore (IN); Phani K. Alaparthi, Benguluru (IN); George Vergis, Portland, OR (US); Bill Nale, Livermore, CA (US); Konika Ganguly, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 677 days.

(21) Appl. No.: 17/133,484

(22) Filed: Dec. 23, 2020

(65) Prior Publication Data
US 2021/0151083 A1    May 20, 2021

(51) Int. Cl.
| | |
|---|---|
| *G11C 5/14* | (2006.01) |
| *G06F 1/3225* | (2019.01) |
| *G06F 1/3228* | (2019.01) |
| *G06F 1/3234* | (2019.01) |
| *G06F 1/3296* | (2019.01) |
| *G11C 11/4074* | (2006.01) |

(52) U.S. Cl.
CPC ............ *G11C 5/148* (2013.01); *G06F 1/3225* (2013.01); *G06F 1/3228* (2013.01); *G06F 1/3243* (2013.01); *G06F 1/3296* (2013.01); *G11C 5/141* (2013.01); *G11C 5/147* (2013.01); *G11C 11/4074* (2013.01); *G11C 2207/2227* (2013.01)

(58) Field of Classification Search
CPC ......... G11C 5/148; G11C 5/141; G11C 5/147; G11C 11/4074; G11C 5/04; G06F 1/3225; G06F 1/3243; G06F 1/3275; G06F 1/3296
See application file for complete search history.

(56) References Cited

U.S. PATENT DOCUMENTS

| | | | |
|---|---|---|---|
| 8,924,755 B2 | 12/2014 | Haj-Yihia | |
| 2009/0154257 A1 | 6/2009 | Fujioka et al. | |

(Continued)

OTHER PUBLICATIONS

Extended European Search Report for Patent Application No. 21198562.7, Mailed Mar. 14, 2022, 10 pages.

(Continued)

*Primary Examiner* — Mushfique Siddique
(74) *Attorney, Agent, or Firm* — Compass IP Law PC

(57) ABSTRACT

Examples described herein relate to a device that includes: a first power rail to provide a signal from a power source to a reference supply voltage pin of a memory controller; a second power rail to provide a signal from the power source to an output buffer pin of the memory controller and to an output buffer pin of a central processing unit (CPU). In some examples, the second power rail is separate from the first power rail, during a high power state, the power source is to supply a same voltage to each of the reference supply voltage pin, the output buffer pin of the memory controller, and the output buffer pin of the CPU, and during a connected standby state, the power source is to reduce voltage provided to the output buffer pin of the memory controller and the output buffer pin of the CPU using the second power rail and maintain a voltage provided to the reference supply voltage pin.

21 Claims, 9 Drawing Sheets

(56) References Cited

U.S. PATENT DOCUMENTS

| | | | |
|---|---|---|---|
| 2010/0246298 A1* | 9/2010 | Zhang | G11C 29/021 |
| | | | 365/201 |
| 2012/0102346 A1* | 4/2012 | Haj-Yihia | G06F 1/3234 |
| | | | 713/322 |
| 2014/0082385 A1* | 3/2014 | Reule | G06F 1/3296 |
| | | | 713/320 |
| 2019/0361516 A1 | 11/2019 | Bhattacharyya et al. | |
| 2020/0066324 A1* | 2/2020 | He | G11C 11/40615 |

OTHER PUBLICATIONS

Reddy, P. Nagabhushan, Reddy, T. Bhaskara, "Latest Power Management Technologies for Mobile Computing Devices", International Journal of Recent Technology and Engineering (IJRTE), ISSN: 2277-3878, vol. 7, Issue-5C, Feb. 2019, 3 pages.

* cited by examiner

POWER CONTROL OF A MEMORY DEVICE IN CONNECTED STANDBY STATE

Microprocessors and central processing units (CPUs) are increasing in transistor density and frequency of operation. Computer designers and manufacturers are faced with corresponding increases in power and energy consumption. Particularly in mobile devices, such as laptop computers, wireless handsets, smart phones, smart watches, tablet computers, etc., increased power consumption can lead to overheating or reduce battery life. Because batteries typically have a limited capacity, running the processor of a mobile device more than necessary could drain the capacity more quickly than desired.

DETAILED DESCRIPTION

Figure 1:
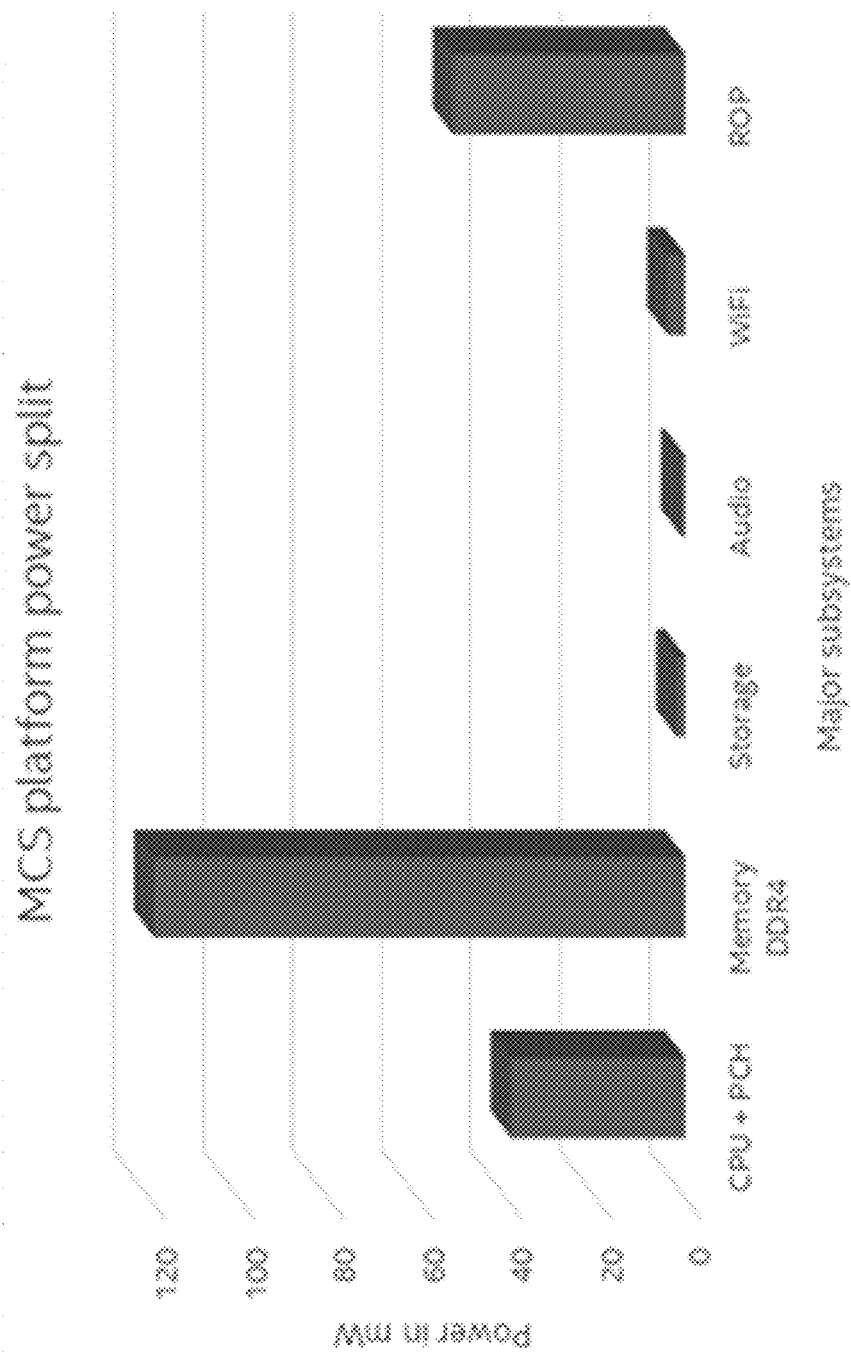
FIG. 1 depicts an example system.

To manage power consumption, today's high end CPUs have two distinct power-down modes, e.g., C-states and S-states. In C-states the CPU is put into sleep mode while maintaining context and appearing architecturally active to the system, also referred to as an idle state. In S-states the CPU is powered off and a boot process is required to restart it. Operating systems typically support a built-in power management software interface such as Advanced Configuration and Power Interface (ACPI) an open industry specification standard first published in 1996, in which the CPU is placed into lower power sleep states based on reduced activity or demand. Among other aspects, the ACPI defines the lower power sleep states as a progression of C-states that can be supported by processors and/or chipsets.

When there is no user activity, a computing system can transition into Connected Standby (CS) mode. CS mode allows for reduction in power use by a CPU. A voltage regulator can reduce power provided to the CPU. During CS mode, power can be made available for a CPU to refresh CPU registers but the CPU may be idle. The CS power state involves frequent transitions between a low-power idle mode and short periods of normal power-level activity. During periods of normal power-level activity, the system can execute applications and transmit and receive packets with data related to background application refresh, application updates, and so forth. During the activity periods, the system is in standby and a display screen is turned off but the operating system (OS) and applications continue to execute using lower power. This combination results in low average power usage and longer battery life during standby mode.

Double data rate (DDR) data bus technology is prevalent as the communication technology between a main memory controller of a computing system and the computing system's main memory. For example, the Joint Electron Device Engineering Council (JEDEC) publishes DDR data bus standards (e.g., DDR3, DDR4, DDR5, etc.) that have received wide adoption in the computer industry as an interface standard utilized by memory controller designers and memory chip suppliers. See, for example, SDRAM DDRx, where x is a version number and an integer that is 3 or more. See, for example, JESD79-3, JESD79-4, and JESD79-5 that correspond to respective DDR3, DDR4, and DDR5.

Where volatile memory devices are used, memory devices need power to retain data. Because applications and user activity are stored in the memory device, a controller puts the memory device into self-refresh mode by supplying power. During a self refresh operation, power supply pins of a memory device (e.g., VDD1, VDD2, and VDDCA pins) are supplied with power by a voltage regulator (VR) so that the memory device can refresh memory content according to a refresh interval. For example, the JEDEC Spec defines a refresh rate, tREFI, of 7.8 μs (3.9 μs for T>85° C.) for DDRx devices. However, even in idle mode, a DDRx compatible memory device can consume over half of the system power in the connected standby mode.

Allowed power dissipation during CS can depends on the capacity of battery in the device. For example, for Microsoft® or Android operating systems, mobile device power dissipation during CS is approximately 5 mW. For tablets and dual display devices, a power dissipation budget during CS can be approximately 16 mW. For personal computers (PCs) or laptops, a power dissipation budget during CS can be approximately 80 mW.

When a system is in a fully operational state (e.g., S0), applications can be run by copying the instances into the volatile memory (e.g., random access memory (RAM)) from storage for faster access. When there is no user activity, devices can transition into low power state (CS mode) with very limited resources. As the applications are still running, a memory controller and memory devices are to be powered to retain user contents (e.g., application executable and unsaved data). At the entry of CS mode, a memory controller can put the memory devices into self-refresh mode to reduce power consumption. FIG. 1 shows an example of power consumption in a platform in connected standby state. In some solutions, the memory controller and memory device are connected to a output stage drain power voltage pin (VDDQ) and the VDDQ supply rail consumes approximately 55% of system power during CS mode.

Figure 2:
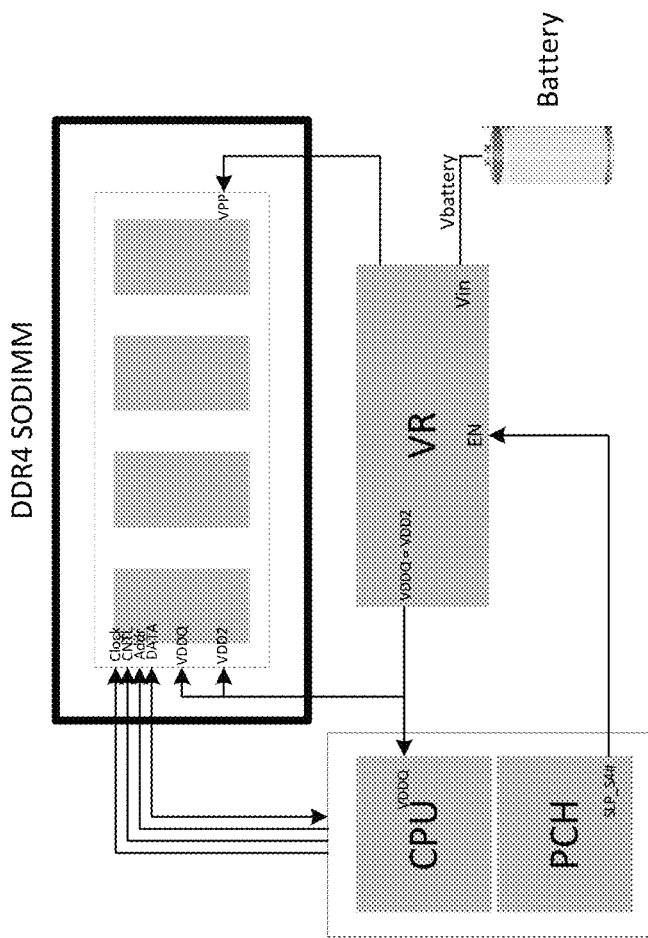
FIG. 2 depicts an example system.

FIG. 2 shows an example system. A voltage regulator (VR) can provide VDDQ and VDD2 signals to DDR4 small outline dual in-line memory module (SODIMM) using a single pin VDDQ. For example, VDDQ and VDD2 pins of a memory controller and memory devices can be powered using the same power supply via output VDDQ from VR. This system does not allow differentiation of power levels supplied to VDDQ and VDD2 of the memory device. During CS mode, if one of VDDQ or VDD2 pins is to receive lower voltage level but another of the pins is to receive regular voltage level, the pins receive the same voltage level. Accordingly, power use cannot be reduced during CS mode.

As system suppliers are moving towards lower power devices and extending battery life, each milliwatt (mW) of savings improves user experience by extending battery life. In some examples, bill of material (BOM) cost may be permitted to be increased, to extend time on which a system can be battery powered.

Various embodiments provide separate VDD2 and VDDQ power rails to CPU and memory devices. A pin can be used to connect a control signal (e.g., C10) from a CPU to the VR to trigger lowering the VDDQ voltage during CS mode. In CS mode, various embodiments lower the VDDQ voltage using a separate power rail while allowing the VDD2 voltage to remain the same or change independently. Various embodiments can provide approximately 20 mW of power savings during CS mode by lowering the VDDQ voltage, which in-turn can result-in improvement in battery life. Various embodiments can be used at least for DDR4 and DDR5 memory-based design to save the additional power in the connected standby state. Various embodiments can be used at least for LPDDR-based memory devices.

Figure 3A:
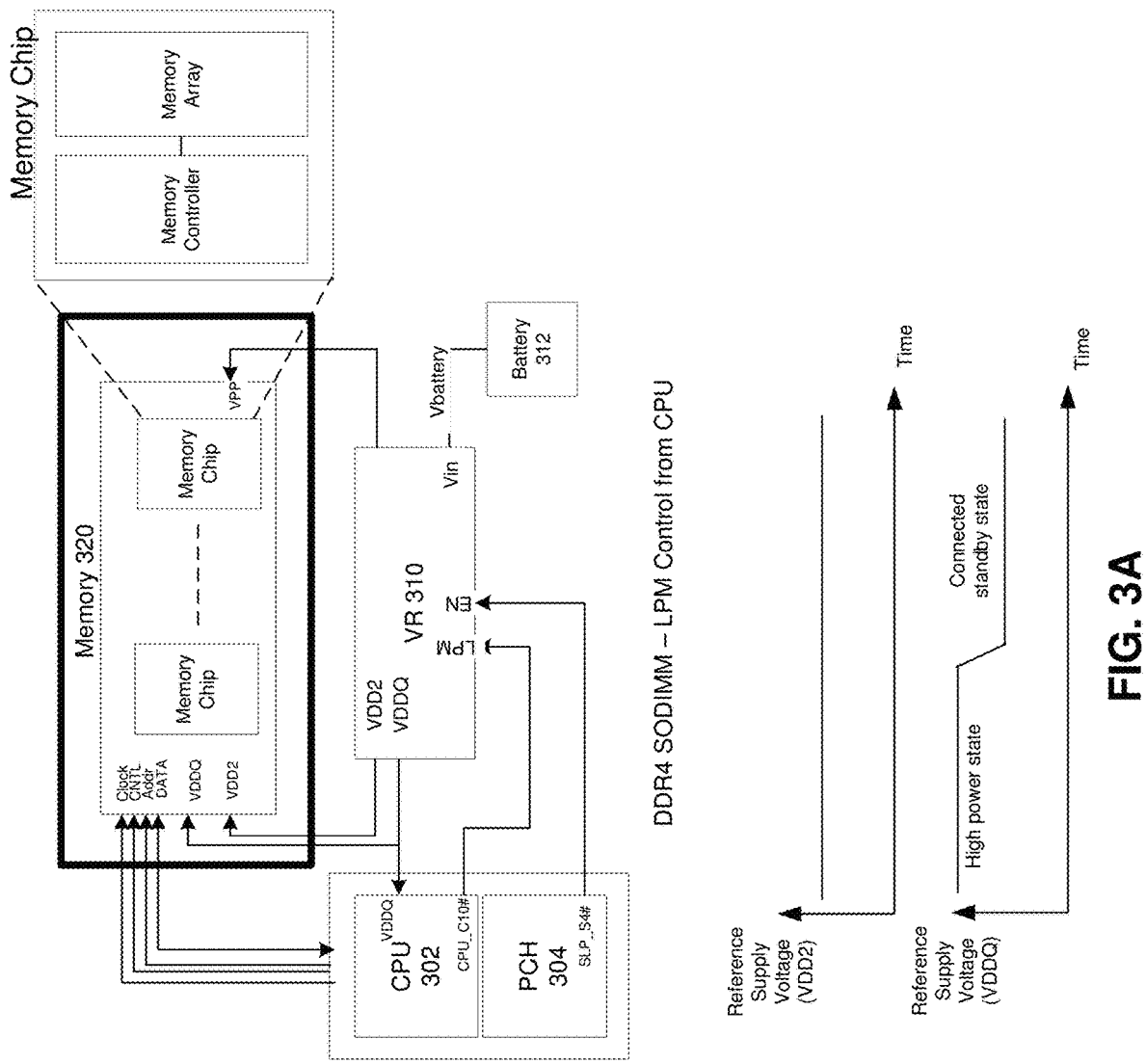
FIGS. 3A and 3B depict example systems

FIG. 3A depicts an example of a system. In some examples, CPU 302 can include one or more of: a processor core, graphics processing unit (GPU), field programmable gate array (FPGA), or application specific integrated circuit (ASIC). In some examples, a core can be sold or designed by Intel®, ARM®, AMD®, Qualcomm®, IBM®, Texas Instruments®, among others. CPU 302 can execute an operating system, driver, applications, and/or a virtualized execution environment (VEE) (e.g., virtual machine or container). In some examples, an operating system (OS) can be Linux®, Windows®, FreeBSD®, Android®, MacOS®, iOS®, or any other operating system.

In some examples, memory chips of memory 320 can be configured as DDR4 small outline dual in-line memory module (SODIMM). Memory 320 can include one or more of: one or more registers, one or more cache devices (e.g., level 1 cache (L1), level 2 cache (L2), level 3 cache (L3), lower level cache (LLC)), volatile memory device, non-volatile memory device, or persistent memory device. For example, memory 320 can include static random access memory (SRAM) memory technology or memory technology consistent with high bandwidth memory (HBM), or double data rate (DDR), among others. Memory 320 can be connected to CPU 302 or PCH 304 using a high speed interface (e.g., DDR, CXL (e.g., Compute Express Link Specification revision 2.0, version 0.9 (2020), as well as earlier versions, revisions or variations thereof), Peripheral Component Interconnect express (PCIe) (e.g., PCI Express Base Specification 1.0 (2002), as well as earlier versions, revisions or variations thereof).

Voltage regulator (VR) 310 can supply power from battery 312 or other power source. In some examples, VR 310 can supply power to CPU 302 and a memory controller of a memory chip independently to pins VDD2 (or VDD) and VDDQ. In some examples, VDD2 (or VDD) pin provides a reference voltage (and a current) to a memory device. In some examples, a VDDQ pin is to provide a voltage and current to memory input/output buffers of a system on chip (SoC), CPU, or processor. In some examples, a VDDQ pin is to provide voltage and current to a memory's input/output buffers. In some examples, VDDQ pin is to supply power to the output transistors of the memory device to provide the potential and energy to drive the load applied to the data output (Q) pins or data input/output (DQ) pins. Other, non-data, output transistors may also be designated to be supplied by pin VDDQ. The potential of VDDQ may be specified the same as or different from that of the primary device power pins (VDD).

As shown, a memory chip can include a memory controller and a memory array. In some examples, power, voltage and/or current supplied to pins VDDQ and VDD2 are provided to one or more of the memory chips. In some examples, CPU 302 can supply a C10 signal to inform VR 310 that CPU 302 is entering a lower power state. In some examples, CPU 302 can utilize SLP S0 signal to indicate entering standby mode or lower power state. In some examples, a processor executed operating system (OS) (e.g., Windows or Linux) can indicate when a system goes to Modern Standby.

In response to CPU 302 entering lower power state, VR 310 can lowers VDDQ voltage (e.g., from 1.2V to 0.6V) so that VR 310 can reduce power to CPU 302 and VDDQ supplies lower voltage to memory 320. But VR 310 can maintain a voltage level supplied to pin VDD2. VDDQ voltage can be used to maintain a physical link between memory 320 and CPU 302 via signals Clock, control (CNTL), Address (Addr), and data (DATA).

In some examples, CPU 302 can supply a C10 signal to inform VR 310 that CPU 302 or its platform is exiting a low power state and returning to S0 state or some other state that consumes more power than low power state. VR 310 can respond by increasing voltage supplied on the VDDQ pin to a regular operating level.

In some examples, VR 310 can supply voltage to a VDD2 pin of DDR4 SODIMM using a first connection and an independent voltage to a VDDQ pin of the DDR4 SODIMM using a second connection. During the S0 state (fully working), VR 310 can supply the same voltage to both the VDDQ and VDD2 power pins of CPU 302 and one or more memory controllers. But when the system transitions into CS mode, one or more memory controllers put their memory device into self-refresh mode, where the DDR4 memory device consumes less power than in the fully working state. At or about the same time as a transition to CS mode, CPU 302 can drive the C10 control signal provided to VR 310 to reduce the VDDQ voltage to less than 0.6V (or other value), to save the additional power consumed by the memory controller and memory device. In some cases, during CS mode, the C10 signal is still available in Ideal or Display Off conditions (e.g., no user activity). In response to a user interrupt, CPU 302 can drive the C10 signal to low or invalid, which cause the VR to raise the VDDQ voltage back to 1.1V (or other value) or to VDD2 voltage level to provide a regular operating (e.g., S0) voltage level to memory 320. Some implementations can provide a power saving in the CS mode of close to 20 mW.

SLP_S4# can provide a signal to maintain the power sequencing for memory voltages.

Figure 3B:
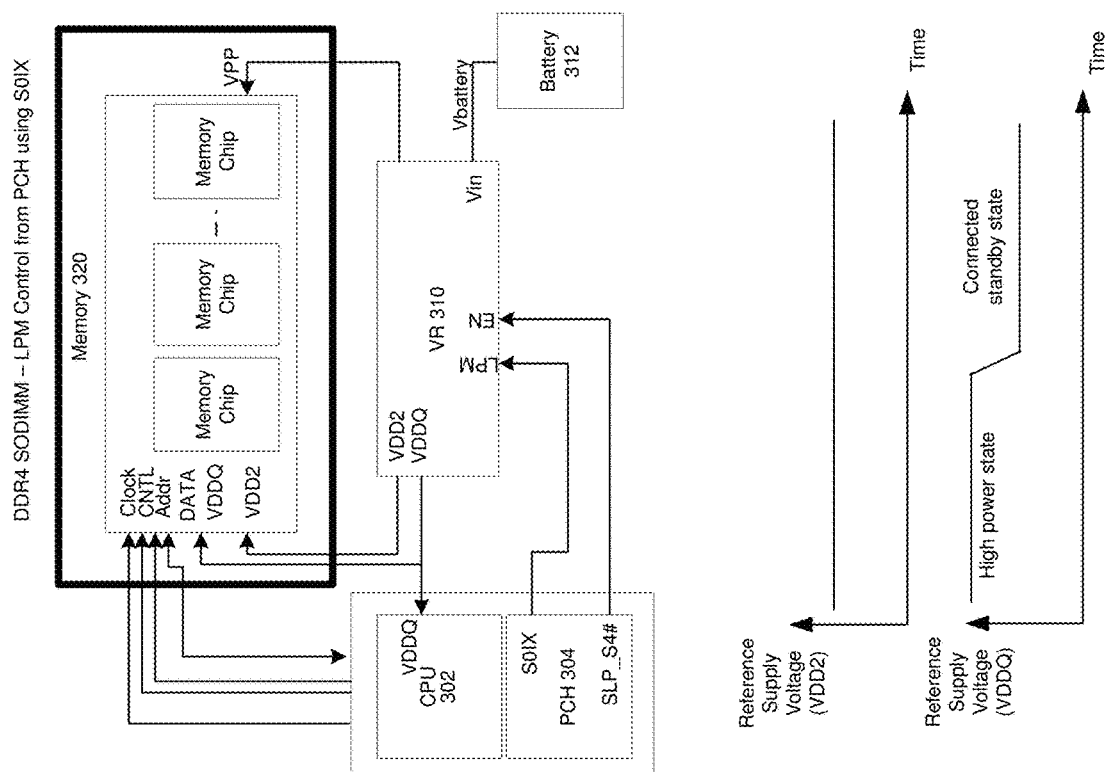

FIG. 3B depicts an example of a system. In this system, a Platform Controller Hub (PCH) 304 can provide input/output (I/O) capabilities for access by or to CPU 302 such as device interfaces (e.g., PCIe, display interface, media interface). PCH 304 can orchestrate CPU boot/wake as well as Reset and Sx (sleep state) flows of the platform.

In this example, PCH 304 can notify VR 310 or a power mode using a signal output from SLP_S0ix to indicate CPU 302 is entering low power mode (e.g., CS mode) or exiting low power mode. In response to receipt of an indication of entry into low power mode, VR 310 can lower VDDQ voltage (e.g., from 1.2V to 0.6V) so that VR 310 can reduce power to CPU 302 and VDDQ supplies lower voltage to memory 320. But VR 310 can maintain a voltage level supplied to VDD2. VDDQ voltage can be used to maintain a physical link between memory and CPU via signals Clock, control (CNTL), Address (Addr), and data (DATA).

In some examples, PCH 304 can supply a S0IX signal to inform VR 310 that CPU 302 is exiting a low power state and returning to S0 state or some other state that consumes more power than low power state. VR 310 can respond by increasing voltage supplied on the VDDQ pin to regular level.

Figure 4A:
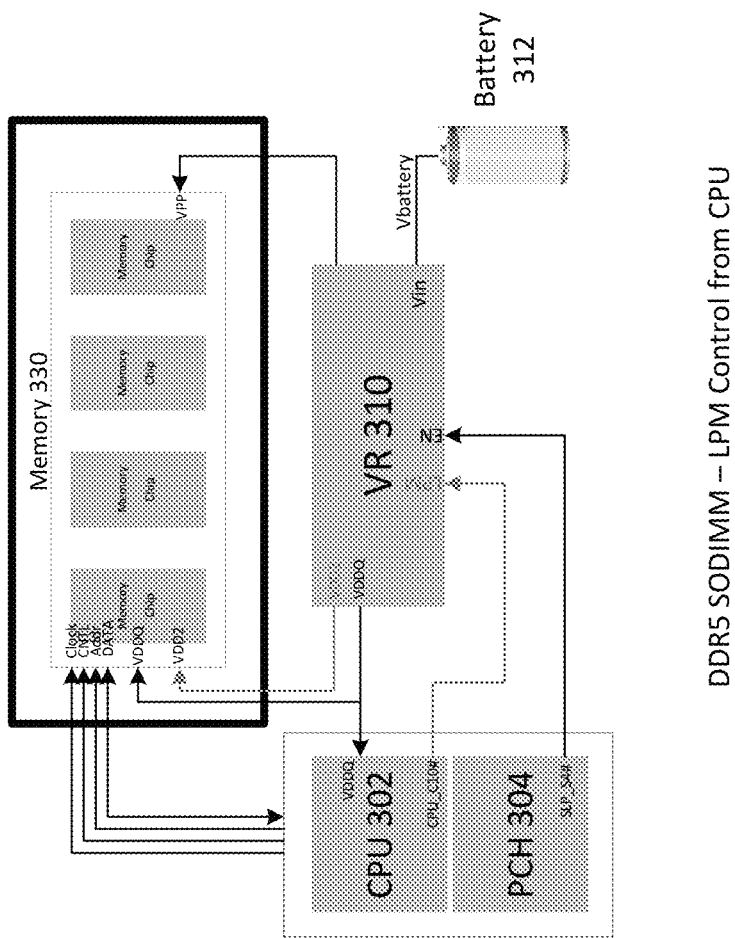
FIGS. 4A and 4B depict example systems

FIG. 4A depicts an example of a DDR5 SODIMM. In this example, memory 330 include an DDR5 consistent SODIMM. CPU 302 can indicate low power mode (LPM) entry or exit to VR 310. Operation of VR 310 in response to entry and exit from LPM can be similar to that described with respect to FIG. 3A.

Figure 4B:
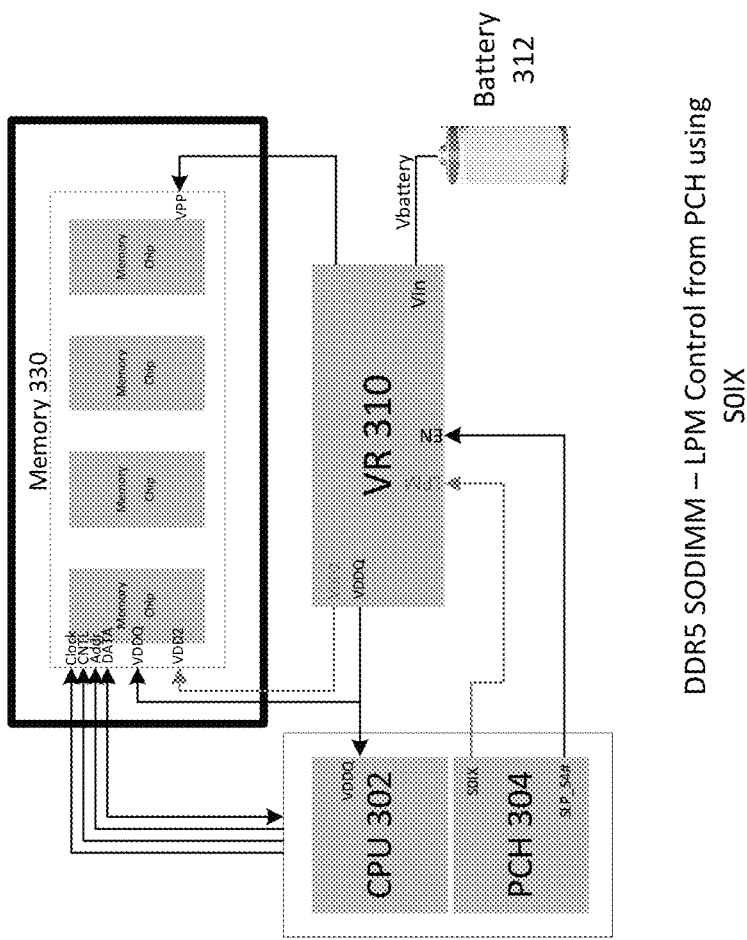

FIG. 4B depicts an example of use of a DDR5 consistent memory device. In this example, memory device 330 is an DDR5 consistent SODIMM. PCH 304 can indicate low power mode (LPM) entry or exit to VR using an S0IX pin. Operation of VR 310 in response to entry and exit from LPM can be similar to that described with respect to FIG. 3B.

Figure 5:
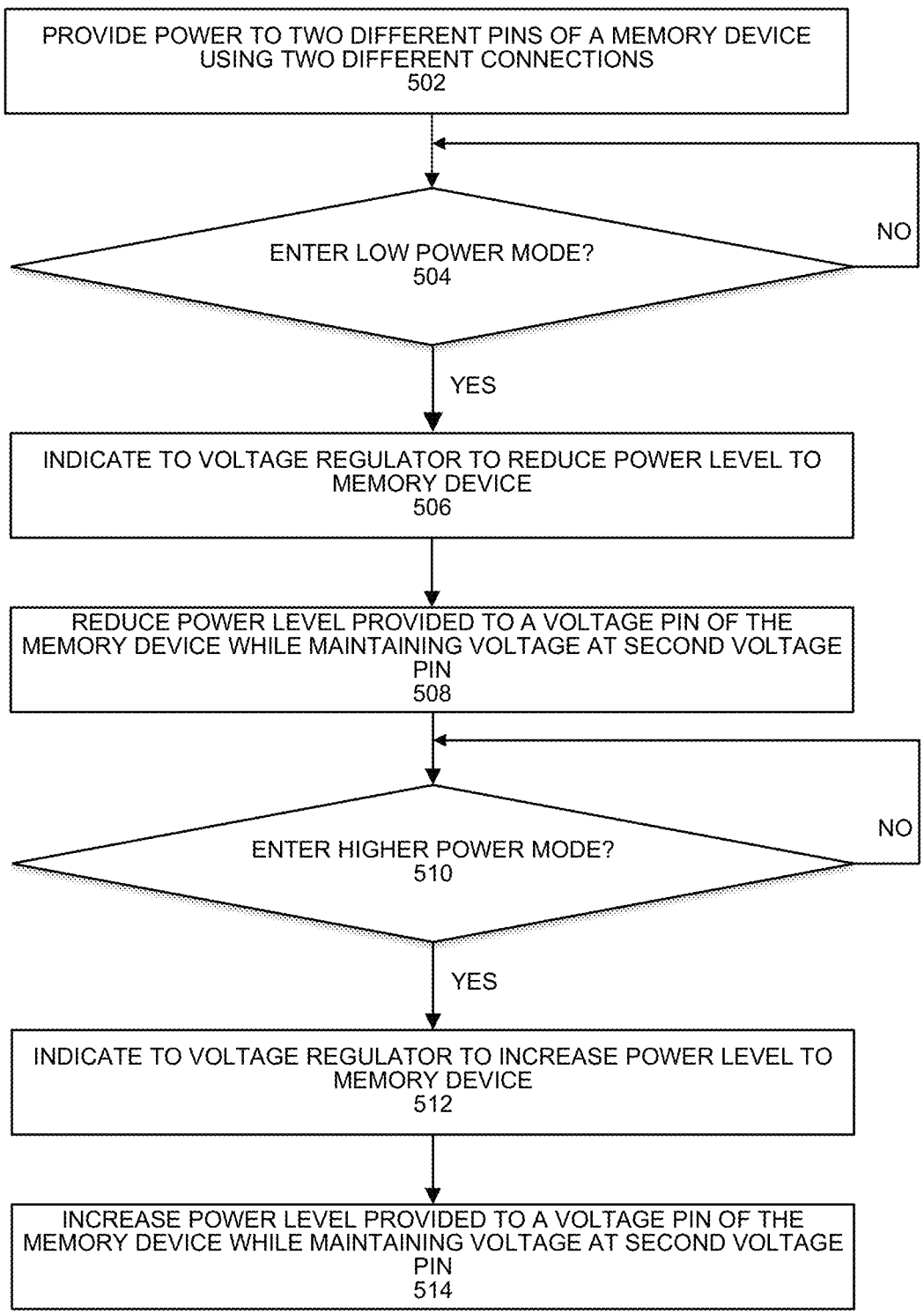
FIG. 5 depicts an example process.

FIG. 5 depicts a process. The process can be performed by a computing platform to reduce power or increase power supplied to a memory device. The memory device can be any type of DDRx compatible DIMM. At 502, power can be provided to a VDD2 pin (e.g., reference voltage) of a memory device using a first connection and voltage to a VDDQ pin of the memory device using a second connection. A connection can be a signal conductor. The first and second connections can be separated by an insulator. In some examples, VDDQ pin is to supply power to the output transistors of the memory device to provide the potential and energy to drive the load applied to the data output (Q) pins or data input/output (DQ) pins. The power can be provided via a voltage regulator from a battery supply or other energy supply (e.g., capacitor, solar, turbine, motion-based energy supply). During a full power state, full voltage levels can be supplied to both the VDDQ and VDD2 power pins of a CPU and memory controller.

At 504, a determination can be made if a change is detected in power mode from full power to low power mode. The determination can be made at a CPU, OS, or PCH. If low power mode is detected, the process can proceed to 506. If low power mode is not detected, the process can repeat 504.

At 506, a control signal can be sent to a voltage regulator to reduce power to a VDDQ pin. In some examples, a CPU or PCH can provide the control signal to reduce the voltage provided to the VDDQ pin. At 508, the VDDQ voltage can be driven to lower voltage while maintaining a voltage level supplied to a VDD2 pin. The first connection that supplies voltage to the VDD2 can be separate and insulated from the second connection that supplies a voltage to VDDQ pins. The second connection can supply voltages to the VDDQ pins of the memory device and a CPU.

At 510, a determination can be made if a change is detected in power mode from low power to higher power mode. For example, lower power mode can be S1 and higher power mode can be S0. In some examples, S0 is a highest power consuming mode and allows more power consumption than S1. The determination can be made at a CPU, OS, or PCH. For example, in response to an application interrupt to perform an operation, the process can determine to enter higher power mode. If a higher power mode is detected, the process can proceed to 512. If higher power mode is not detected, the process can repeat 510.

At 512, a control signal can be sent to the voltage regulator to increase power provided to VDDQ pins. In some examples, a CPU or PCH can provide the control signal to cause an increase in the voltage provided to the VDDQ pin. At 514, the VDDQ voltage can be driven to a higher voltage (e.g., regular level) while maintaining a voltage level supplied to a VDD2 pin. The second connection can be used to supply voltages to the VDDQ pins of the memory device and a CPU.

Figure 6:
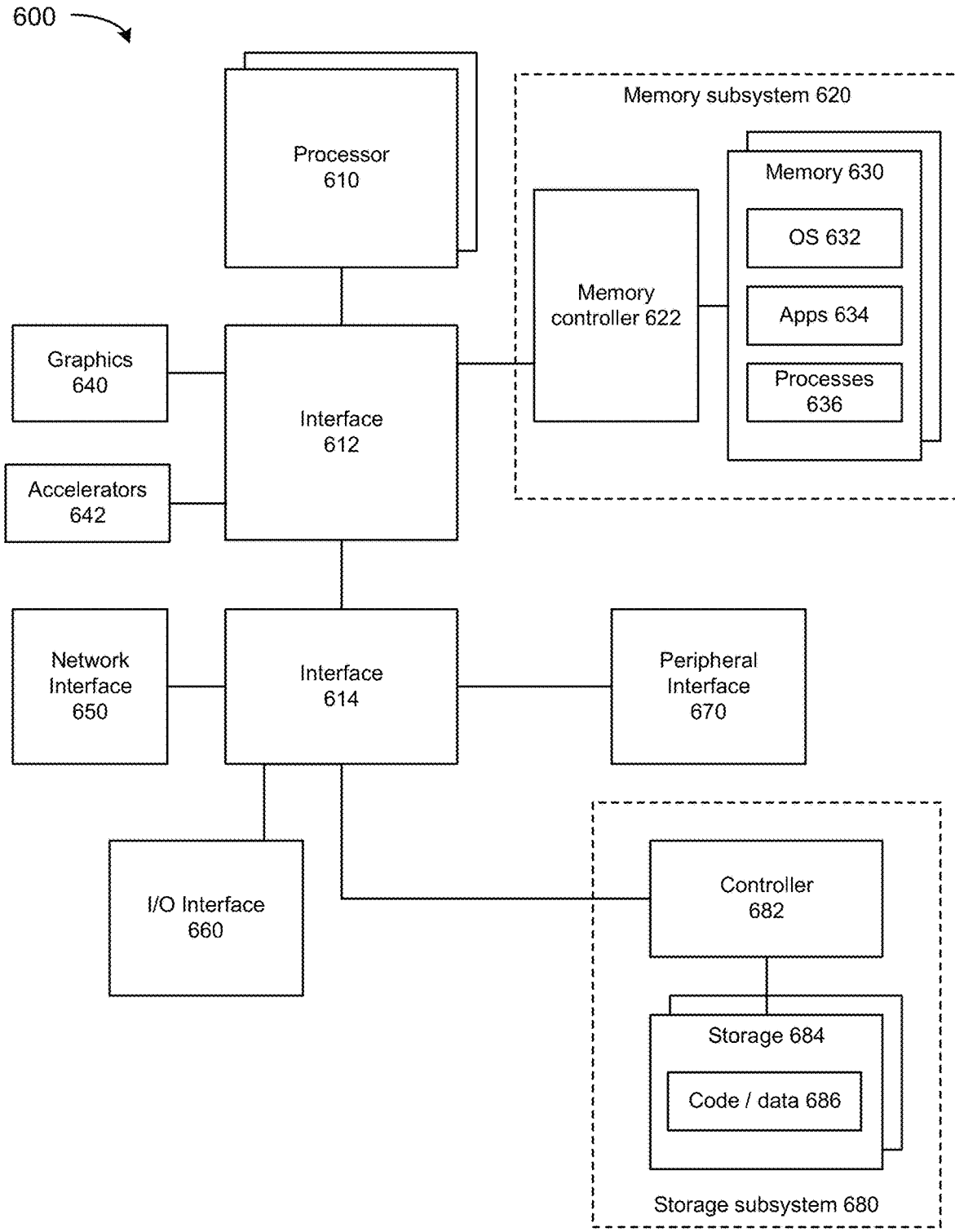
FIG. 6 depicts a system.

FIG. 6 depicts a system. The system can use embodiments described herein to manage power level supplied to a memory device during a low power mode (e.g., CS). System 600 includes processor 610, which provides processing, operation management, and execution of instructions for system 600. Processor 610 can include any type of microprocessor, central processing unit (CPU), graphics processing unit (GPU), processing core, or other processing hardware to provide processing for system 600, or a combination of processors. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 600 includes interface 612 coupled to processor 610, which can represent a higher speed interface or a high throughput interface for system components that needs higher bandwidth connections, such as memory subsystem 620 or graphics interface components 640, or accelerators 642. Interface 612 represents an interface circuit, which can be a standalone component or integrated onto a processor die. Where present, graphics interface 640 interfaces to graphics components for providing a visual display to a user of system 600. In one example, graphics interface 640 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 640 generates a display based on data stored in memory 630 or based on operations executed by processor 610 or both. In one example, graphics interface 640 generates a display based on data stored in memory 630 or based on operations executed by processor 610 or both.

Accelerators 642 can be a programmable or fixed function offload engine that can be accessed or used by a processor 610. For example, an accelerator among accelerators 642 can provide compression (DC) capability, cryptography services such as public key encryption (PKE), cipher, hash/authentication capabilities, decryption, or other capabilities or services. In some embodiments, in addition or alternatively, an accelerator among accelerators 642 provides field select controller capabilities as described herein. In some cases, accelerators 642 can be integrated into a CPU socket (e.g., a connector to a motherboard or circuit board that includes a CPU and provides an electrical interface with the CPU). For example, accelerators 642 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators 642 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 620 represents the main memory of system 600 and provides storage for code to be executed by processor 610, or data values to be used in executing a routine. Memory subsystem 620 can include one or more memory devices 630 such as read-only memory (ROM), flash memory, one or more varieties of random access memory (RAM) such as DRAM, or other memory devices, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software logic to provide functions for system 600. In one example, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610.

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 600 includes interface 614, which can be coupled to interface 612. In one example, interface 614 represents an interface circuit, which can include stand-alone components and integrated circuitry. In one example, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can transmit data to a device that is in the same data center or rack or a remote device, which can include sending data stored in memory. Network interface 650 can receive data from a remote device, which can include storing received data into memory. Various embodiments can be used in connection with network interface 650, processor 610, and memory subsystem 620.

In one example, system 600 includes one or more input/output (I/O) interface(s) 660. I/O interface 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one example, system 600 includes storage subsystem 680 to store data in a nonvolatile manner. In one example, in certain system implementations, at least certain components of storage 680 can overlap with components of memory subsystem 620. Storage subsystem 680 includes storage device(s) 684, which can be or include any conventional medium for storing large amounts of data in a nonvolatile manner, such as one or more magnetic, solid state, or optical based disks, or a combination. Storage 684 holds code or instructions and data 686 in a persistent state (e.g., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (e.g., the value or state of the data is indeterminate if power is interrupted to system 600). In one example, storage subsystem 680 includes controller 682 to interface with storage 684. In one example controller 682 is a physical part of interface 614 or processor 610 or can include circuits or logic in both processor 610 and interface 614.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). Another example of volatile memory includes cache or static random access memory (SRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Triple-Level Cell ("TLC"), Quad-Level Cell ("QLC"), Penta-Level Cell ("PLC") (e.g., 5 bits per cell) or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 600. More specifically, power source typically interfaces to one or multiple power supplies in system 600 to provide power to the components of system 600. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 600 can be implemented using interconnected compute sleds of processors, memories, storages, network interfaces, and other components. High speed interconnects can be used such as PCIe, Ethernet, or optical interconnects (or a combination thereof).

Figure 7:
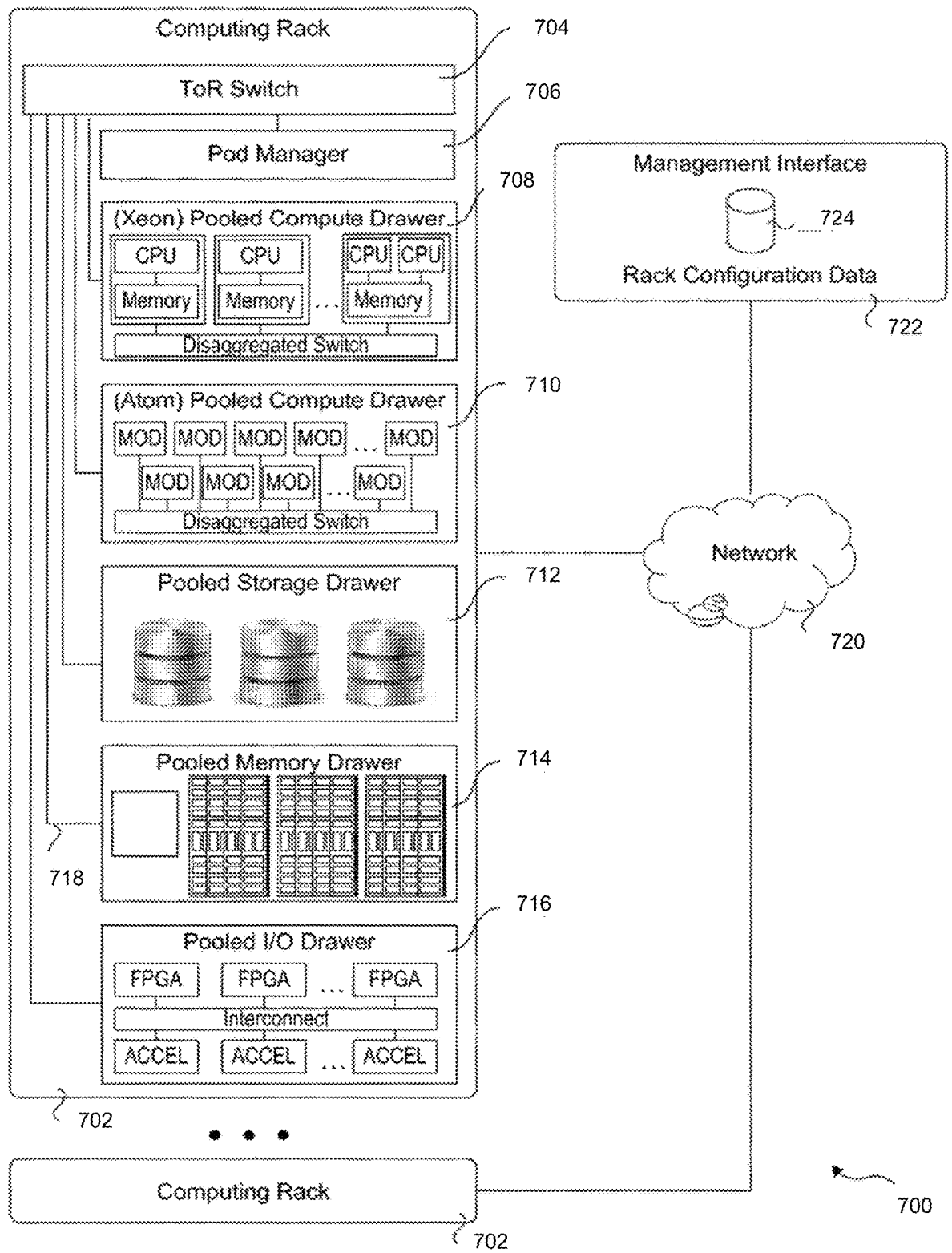
FIG. 7 depicts an example environment.

FIG. 7 depicts an environment 700 includes multiple computing racks 702, each including a Top of Rack (ToR) switch 704, a pod manager 706, and a plurality of pooled system drawers. The environment can use embodiments described herein to manage power level supplied to a memory device during a low power mode (e.g., CS). Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an Intel® XEON® pooled computer drawer 708, and Intel® ATOM™ pooled compute drawer 710, a pooled storage drawer 712, a pooled memory drawer 714, and a pooled I/O drawer 716. Each of the pooled system drawers is connected to ToR switch 704 via a high-speed link 718, such as an Ethernet link or Silicon Photonics (SiPh) optical link.

Multiple of the computing racks 702 may be interconnected via their ToR switches 704 (e.g., to a pod-level switch or data center switch), as illustrated by connections to a network 720. In some embodiments, groups of computing racks 702 are managed as separate pods via pod manager(s) 706. In some embodiments, a single pod manager is used to manage all of the racks in the pod. Alternatively, distributed pod managers may be used for pod management operations.

Environment 700 further includes a management interface 722 that is used to manage various aspects of the environment. This includes managing rack configuration, with corresponding parameters stored as rack configuration data 724. Environment 700 can be used for computing racks.

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

In some examples, network interface and other embodiments described herein can be used in connection with a base station (e.g., 3G, 4G, 5G and so forth), macro base station (e.g., 5G networks), picostation (e.g., an IEEE 802.11 compatible access point), nanostation (e.g., for Point-to-MultiPoint (PtMP) applications), on-premises data centers, off-premises data centers, edge network elements, fog network elements, and/or hybrid data centers (e.g., data center that use virtualization, cloud and software-defined networking to deliver application workloads across physical data centers and distributed multi-cloud environments).

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," or "logic." A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z.'"

Illustrative examples of the devices, systems, and methods disclosed herein are provided below. An embodiment of the devices, systems, and methods may include any one or more, and any combination of, the examples described below.

Flow diagrams as illustrated herein provide examples of sequences of various process actions. The flow diagrams can indicate operations to be executed by a software or firmware routine, as well as physical operations. In some embodiments, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, and so forth.

Example 1 includes an apparatus comprising: a first power rail to provide a signal from a power source to a reference supply voltage pin of a memory controller; a second power rail to provide a signal from the power source to an output buffer pin of the memory controller and to an output buffer pin of a central processing unit (CPU), wherein: the second power rail is separate from the first power rail, during a high power state, the power source is to supply a same voltage to each of the reference supply voltage pin, the output buffer pin of the memory controller, and the output buffer pin of the CPU, and during a connected standby state, the power source is to reduce voltage provided to the output buffer pin of the memory controller and the output buffer pin of the CPU using the second power rail and maintain a voltage provided to the reference supply voltage pin.

Example 2 includes any example, wherein the reference supply voltage pin comprises a VDD2 pin.

Example 3 includes any example, wherein the output buffer pin of the memory controller comprises a VDDQ pin and the output buffer pin of the CPU comprises a VDDQ pin.

Example 4 includes any example, and includes a memory device and wherein during the connected standby state, the memory controller is to place the memory device into self-refresh mode, where memory device consumes less power than a fully working state.

Example 5 includes any example, wherein the memory device is consistent with Joint Electron Device Engineering Council (JEDEC) double data rate (DDR) data bus technology.

Example 6 includes any example, wherein: entrance to a higher power state is to cause the power source to increase the voltage provided to the output buffer pin of the memory controller and the output buffer pin of the CPU and maintain a voltage provided to the reference supply voltage pin.

Example 7 includes any example, and includes the CPU, wherein the CPU is to indicate entrance to the connected standby state or entrance to a higher power state.

Example 8 includes any example, and includes a Platform Controller Hub to indicate entrance to the connected standby state or entrance to a higher power state.

Example 9 includes any example, wherein the power source comprises a voltage regulator coupled to a battery.

Example 10 includes any example, and includes a system comprising: at least one memory device; at least one processor comprising a central processing unit (CPU); a power source; a first power rail to provide a signal from a power source to a reference supply voltage pin of a memory controller of a memory device of the at least one memory device; and a second power rail to provide a signal from the power source to an output buffer pin of the memory controller and to an output buffer pin of the CPU, wherein: the second power rail is separate from the first power rail, during a high power state, the power source is to supply a same voltage to each of the reference supply voltage pin, the output buffer pin of the memory controller, and the output buffer pin of the CPU, and during a connected standby state, the power source is to reduce voltage provided to the output buffer pin of the memory controller and the output buffer pin of the CPU using the second power rail and maintain a voltage provided to the reference supply voltage pin.

Example 11 includes any example, wherein the reference supply voltage pin comprises a VDD2 pin.

Example 12 includes any example, wherein the output buffer pin of the memory controller comprises a VDDQ pin and the output buffer pin of the CPU comprises a VDDQ pin.

Example 13 includes any example, wherein during the connected standby state, the memory controller is to place the memory device into self-refresh mode, where memory device consumes less power than a fully working state.

Example 14 includes any example, wherein the memory device is consistent with Joint Electron Device Engineering Council (JEDEC) double data rate (DDR) data bus technology.

Example 15 includes any example, wherein: entrance to a higher power state is to cause the power source to increase the voltage provided to the output buffer pin of the memory controller and the output buffer pin of the CPU and maintain a voltage provided to the reference supply voltage pin.

Example 16 includes any example, wherein the CPU is to indicate entrance to the connected standby state or entrance to a higher power state.

Example 17 includes any example, and includes a Platform Controller Hub to indicate entrance to the connected standby state or entrance to a higher power state.

Example 18 includes any example, wherein the at least one memory device is part of a server, rack of servers, data center, or edge network element and the at least one memory device is to enter low power mode by a change of a voltage to one voltage pin while maintaining a voltage level provided to another voltage pin.

Example 19 includes any example, and includes a method comprising: providing power using a first power rail to a reference supply voltage pin of a memory controller of a memory device and providing power using a second power rail to an output buffer pin of the memory controller and to an output buffer pin of a processor, wherein: the second power rail is separate from the first power rail, during a high power state, a same voltage is supplied to each of the reference supply voltage pin, the output buffer pin of the memory controller, and the output buffer pin of the processor, and during a connected standby state, a reduced voltage is provided to the output buffer pin of the memory controller and the output buffer pin of the processor using the second power rail while a voltage level provided to the reference supply voltage pin is maintained.

Example 20 includes any example, wherein: the reference supply voltage pin comprises a VDD2 pin, the output buffer pin of the memory controller comprises a VDDQ pin, and the output buffer pin of the processor comprises a VDDQ pin.

Example 21 includes any example, wherein the memory device is consistent with Joint Electron Device Engineering Council (JEDEC) double data rate (DDR) data bus technology.

What is claimed is:

1. An apparatus comprising:
   a first power rail to provide a signal from a power source to a reference supply voltage pin of a memory controller; and
   a second power rail to provide a signal from the power source to an output buffer pin of the memory controller and to an output buffer pin of a central processing unit (CPU), wherein:
   the output buffer of the memory controller comprises an input/output buffer of a memory device,
   the second power rail is separate from the first power rail,
   the first power rail and the second power rail are configured to provide same voltage levels during a high power state and to provide different voltage levels during a connected standby state,
   during the high power state, the power source is to supply a same voltage to each of the reference supply voltage pin, the output buffer pin of the memory controller, and the output buffer pin of the CPU, and
   during the connected standby state, the power source is to reduce voltage provided to the output buffer pin of the memory controller and the output buffer pin of the CPU using the second power rail and maintain a voltage provided to the reference supply voltage pin.

2. The apparatus of claim 1, wherein the reference supply voltage pin comprises a VDD2 pin.

3. The apparatus of claim 1, wherein the output buffer pin of the memory controller comprises a VDDQ pin and the output buffer pin of the CPU comprises a VDDQ pin.

4. The apparatus of claim 1, comprising the memory device and wherein during the connected standby state, the memory controller is to place the memory device into self-refresh mode to refresh memory content in which the memory device consumes less power than a fully working state.

5. The apparatus of claim 4, wherein the memory device is consistent with Joint Electron Device Engineering Council (JEDEC) double data rate (DDR) data bus technology.

6. The apparatus of claim 1, wherein:
   entrance to a higher power state is to cause the power source to increase the voltage provided to the output buffer pin of the memory controller and the output buffer pin of the CPU and maintain a voltage provided to the reference supply voltage pin.

7. The apparatus of claim 1, comprising the CPU, wherein the CPU is to indicate entrance to the connected standby state or entrance to a higher power state.

8. The apparatus of claim 1, comprising a Platform Controller Hub to indicate entrance to the connected standby state or entrance to a higher power state.

9. The apparatus of claim 1, wherein the power source comprises a voltage regulator coupled to a battery.

10. A system comprising:
at least one memory device;
at least one processor comprising a central processing unit (CPU);
a power source;
a first power rail to provide a signal from a power source to a reference supply voltage pin of a memory controller of a memory device of the at least one memory device; and
a second power rail to provide a signal from the power source to an output buffer pin of the memory controller and to an output buffer pin of the CPU, wherein:
the output buffer of the memory controller comprises an input/output buffer of a memory device,
the second power rail is separate from the first power rail,
the first power rail and the second power rail are configured to provide same voltage levels during a high power state and to provide different voltage levels during a connected standby state,
during the high power state, the power source is to supply a same voltage to each of the reference supply voltage pin, the output buffer pin of the memory controller, and the output buffer pin of the CPU, and
during the connected standby state, the power source is to reduce voltage provided to the output buffer pin of the memory controller and the output buffer pin of the CPU using the second power rail and maintain a voltage provided to the reference supply voltage pin.

11. The system of claim 10, wherein the reference supply voltage pin comprises a VDD2 pin.

12. The system of claim 10, wherein the output buffer pin of the memory controller comprises a VDDQ pin and the output buffer pin of the CPU comprises a VDDQ pin.

13. The system of claim 10, wherein during the connected standby state, the memory controller is to place the memory device into self-refresh mode to refresh memory content in which the memory device consumes less power than a fully working state.

14. The system of claim 10, wherein the memory device is consistent with Joint Electron Device Engineering Council (JEDEC) double data rate (DDR) data bus technology.

15. The system of claim 10, wherein:
entrance to a higher power state is to cause the power source to increase the voltage provided to the output buffer pin of the memory controller and the output buffer pin of the CPU and maintain a voltage provided to the reference supply voltage pin.

16. The system of claim 10, wherein the CPU is to indicate entrance to the connected standby state or entrance to a higher power state.

17. The system of claim 10, comprising a Platform Controller Hub to indicate entrance to the connected standby state or entrance to a higher power state.

18. The system of claim 10, wherein the at least one memory device is part of a server, rack of servers, data center, or edge network element and the at least one memory device is to enter low power mode by a change of a voltage to one voltage pin while maintaining a voltage level provided to another voltage pin.

19. A method comprising:
providing power using a first power rail to a reference supply voltage pin of a memory controller of a memory device and
providing power using a second power rail to an output buffer pin of the memory controller and to an output buffer pin of a processor, wherein:
the output buffer of the memory controller comprises an input/output buffer of a memory device,
the second power rail is separate from the first power rail,
the first power rail and the second power rail are configured to provide same voltage levels during a high power state and to provide different voltage levels during a connected standby state,
during the high power state, a same voltage is supplied to each of the reference supply voltage pin, the output buffer pin of the memory controller, and the output buffer pin of the processor, and
during the connected standby state, a reduced voltage is provided to the output buffer pin of the memory controller and the output buffer pin of the processor using the second power rail while a voltage level provided to the reference supply voltage pin is maintained.

20. The method of claim 19, wherein:
the reference supply voltage pin comprises a VDD2 pin,
the output buffer pin of the memory controller comprises a VDDQ pin, and
the output buffer pin of the processor comprises a VDDQ pin.

21. The method of claim 19, wherein the memory device is consistent with Joint Electron Device Engineering Council (JEDEC) double data rate (DDR) data bus technology.

* * * * *